US008844351B2

(12) United States Patent
Burdi et al.

(10) Patent No.: US 8,844,351 B2
(45) Date of Patent: Sep. 30, 2014

(54) SOLID STATE FLUID LEVEL SENSOR

(75) Inventors: Roger D. Burdi, Grand Rapids, MI (US); Bruce L. Reniger, Alto, MI (US)

(73) Assignee: Touchsensor Technologies, LLC, Wheaton, IL (US)

( * ) Notice: Subject to any disclaimer, the term of this patent is extended or adjusted under 35 U.S.C. 154(b) by 355 days.

(21) Appl. No.: 13/237,101

(22) Filed: Sep. 20, 2011

(65) Prior Publication Data
US 2012/0006111 A1    Jan. 12, 2012

Related U.S. Application Data

(62) Division of application No. 12/117,789, filed on May 9, 2008, now Pat. No. 8,024,967, which is a division of application No. 10/886,558, filed on Jul. 9, 2004, now Pat. No. 7,373,817.

(51) Int. Cl.
*G01F 23/00* (2006.01)
*F04D 15/02* (2006.01)
*G01F 23/26* (2006.01)
*H05K 1/02* (2006.01)
*H05K 1/16* (2006.01)

(52) U.S. Cl.
CPC .......... *F04D 15/0218* (2013.01); *G01F 23/265* (2013.01); *G01F 23/261* (2013.01); *G01F 23/266* (2013.01); *H05K 1/0268* (2013.01); *G01F 23/268* (2013.01); *H05K 1/16* (2013.01)
USPC ........................ 73/290 R; 73/304 C; 340/620

(58) Field of Classification Search
USPC ...... 73/304 R, 304 C, 290 R, 290 V; 340/620
See application file for complete search history.

(56) References Cited

U.S. PATENT DOCUMENTS 3,588,859 A    6/1971 Petree
3,663,838 A    5/1972 Reimers
(Continued)

FOREIGN PATENT DOCUMENTS

EP    0373809    6/1990
EP    0613026 A1    8/1994
(Continued)

OTHER PUBLICATIONS

Toucriserisor Technology Internet Article Jun. 13, 2004 retrieved from Internet: URL: http://web.archive.org/web/2040613100140/http://touchsensor.com/technology_apps_5.html.
(Continued)

*Primary Examiner* — Peter Macchiarolo
*Assistant Examiner* — Samir M Shah
(74) *Attorney, Agent, or Firm* — Blank Rome LLP

(57) ABSTRACT

A sensor system for sensing liquid level in a bilge, for use in automatic bilge pump actuation. First and second field effect sensors are potted or sealed within a container or the bilge wall and are aligned in a vertical array and each comprise a substantially planar pattern of "electrodes" or conductive traces disposed on a printed circuit board (PCB) along with integrated circuits used to create a loop or arc-shaped electric field. As bilge liquid rises to the proximity or level of the field effect sensors, a change in the arc-shaped electric field is sensed and, in response, a bilge pump is automatically actuated to pump liquid out of the bilge. Optionally, the pump control can be programmed by use of a microprocessor to permit control of on-off timing and prevent undesirable effects of "sloshing."

16 Claims, 8 Drawing Sheets

(56) References Cited

U.S. PATENT DOCUMENTS

| | | | |
|---|---|---|---|
| 3,665,300 | A | 5/1972 | Sauer et al. |
| 4,276,454 | A | 6/1981 | Zathan |
| 4,766,329 | A * | 8/1988 | Santiago ............... 307/118 |
| 4,795,967 | A | 1/1989 | Fredericks |
| 4,800,755 | A | 1/1989 | Fathauer et al. |
| 4,875,497 | A | 10/1989 | Worthington |
| 4,881,873 | A * | 11/1989 | Smith et al. ............ 417/12 |
| 5,017,909 | A | 5/1991 | Goekler |
| 5,238,369 | A * | 8/1993 | Farr ....................... 417/18 |
| 5,287,086 | A * | 2/1994 | Gibb ....................... 340/618 |
| 5,404,048 | A | 4/1995 | Panner |
| 5,425,624 | A | 6/1995 | Williams |
| 5,429,727 | A * | 7/1995 | Vogt et al. ............. 205/779.5 |
| 5,594,222 | A * | 1/1997 | Caldwell ................ 200/600 |
| 6,192,752 | B1 | 2/2001 | Blaine |
| 6,218,682 | B1 | 4/2001 | Zucker et al. |
| 6,218,948 | B1 | 4/2001 | Dana |
| 6,305,214 | B1 * | 10/2001 | Schattke et al. ........... 73/31.05 |
| 6,320,202 | B1 | 11/2001 | Banerjee et al. |
| 6,320,282 | B1 | 11/2001 | Caldwell |
| 6,457,355 | B1 | 10/2002 | Philipp et al. |
| 6,479,915 | B2 | 11/2002 | Hsueh |
| 6,918,296 | B1 * | 7/2005 | Urquidi et al. ............ 73/304 R |
| 6,923,056 | B2 * | 8/2005 | Urquidi ....................... 73/304 C |
| 7,017,409 | B2 | 3/2006 | Zielinski et al. |
| 7,373,817 | B2 | 5/2008 | Burdi et al. |
| 2002/0029613 | A1 * | 3/2002 | Stetter et al. ............ 73/31.05 |
| 2003/0019291 | A1 | 1/2003 | Pchelnikov et al. |
| 2005/0076711 | A1 * | 4/2005 | Urquidi ....................... 73/304 C |
| 2006/0185977 | A1 * | 8/2006 | Wide et al. ................ 204/411 |
| 2006/0261876 | A1 | 11/2006 | Agarwal et al. |
| 2010/0025238 | A1 * | 2/2010 | Gottlieb et al. ............ 204/401 |

FOREIGN PATENT DOCUMENTS

| | | |
|---|---|---|
| GB | 2064135 | 6/1981 |
| JP | 5288592 A | 11/1993 |
| JP | 6127466 A | 5/1994 |
| JP | 6194211 A | 7/1994 |
| JP | 6249963 A | 9/1994 |
| JP | 6336246 A | 12/1994 |
| JP | 2001503205 T | 3/2001 |
| JP | 200943187 | 2/2009 |
| WO | 03052933 | 6/2003 |
| WO | 03052933 A2 | 6/2003 |
| WO | 2004/095388 | 11/2004 |
| WO | 2004/104529 | 12/2004 |
| WO | 2007/002603 | 1/2007 |

OTHER PUBLICATIONS

International Preliminary Report on Patentability (Form PCT/IPEA/409) for related PCT/US05/24235 dated Feb. 15, 2007 (9 pages).

Examiner's First Report on related Australian Patent Application No. 2005271971; dated Apr. 20, 2010 (2 pgs).

Official Action in related Japanese Patent Application No. 2007-520527, dated Oct. 26, 2010 (4 pgs).

First Substantive Examination Report in related European Patent Application No. 05769214.7 dated Feb. 26, 2008 and Oct. 1, 2010 (8 pgs).

International Search Report and Written Opinion dated Jul. 8, 2005 (12 pages) and Written Opinion for related PCT/US05/24235 dated Jun. 12, 2006 (10 pags).

Examination Report for related New Zealand Patent Application No. 553116 dated Aug. 12, 2008 (2 pgs).

Office Action tor related Mexican Patent Application No. MX/a/2007/000358 dated Aug. 24, 2009 (3 pgs).

Examiner's Informal Notification related Indonesian Patent Application No. W-00200700401, dated May 27, 2009.

Anonymous; TouchSensor Technology Internet Article Jun. 13, 2004, retrieved from internet; http://web.archive.org/web/2040613100140/http.touchsensor.com/technology_apps_5.html.

Translation of Office Action issued in related Japanese patent application No. 2007520527 on Oct. 28, 2010 (4 pgs).

* cited by examiner

SOLID STATE FLUID LEVEL SENSOR

CROSS-REFERENCE TO RELATED APPLICATION

This patent application is a divisional of U.S. patent application Ser. No. 12/117,789, filed on May 9, 2008, which is a divisional of U.S. patent application Ser. No. 10/886,558, filed Jul. 9, 2004, the entire disclosures of which are incorporated herein by reference.

BACKGROUND OF THE INVENTION

1. Field of the Invention

The present invention relates to sensors for detecting the presence of a fluid, automatic systems for actuating pumps in response to detecting a fluid level and sensors mounted in the bottom of a boat bilge tank activating a bilge pump when the bilge fluid level reaches a preset distance above the bottom of the bilge tank.

2. Discussion of the Prior Art

In the past, bilge pumps have been activated manually or by mechanical float type switches with mercury or point contacts to complete an electrical circuit activating a pump. Pressure switches have also been used. These prior art switches worked adequately when initially installed. Over time, however, bilge debris and other sources of contamination often prevented the mechanical components from moving as intended, causing switch failure. In addition, prior art bilge pump activation switches typically wore out several times during the life of a boat and, being located in a boat's nether regions, were difficult to access for repair and replacement.

Many fluid level or fluid proximity detectors of the prior art employed electrical switches actuated when a conductor, such as a body of water, moved into close proximity to the detector or sensor. U.S. Pat. Nos. 3,588,859; 3,665,300; 4,800,755 and 4,875,497 disclose such detectors. U.S. Pat. No. 5,017,909, discloses a proximity detector used as a liquid level detector for receptacles in vehicles.

Other applications for liquid level detectors included bilge-pumping systems for ships. A bilge pumping system must be activated before the accumulated water reaches an excessive level. Prior art mechanisms for detection of an excessive bilge water level employed mechanical floatation systems, causing a switch to be actuated whenever the water reached such an undesired level. Bilge fluid or water eventually renders mechanical level sensing systems inoperative in part because bilge fluid can contain many forms of corrosive waste. Replacing failed parts of a bilge level sensing system can be very expensive and troublesome, since a skilled technician must enter the bilge to perform the work.

Many electronic proximity detection systems have been proposed in searching for a solution to this messy, expensive problem. By way of example, Smith et al (U.S. Pat. No. 4,881,873) discloses a capacitive level sensor for a bilge pump including a sensor plate 40 positioned in a bilge at a position selected for pump actuation. The bilge water is sensed as a dielectric, in a manner of speaking, and so the sensor is susceptible to false alarms or missed detections once the contamination accompanying bilge inflow has accumulated in the bilge and contaminated the area around the sensor, and sloshing bilge water is likely to cause the bilge control to actuate when the bilge level does not require pumping.

Gibb (U.S. Pat. No. 5,287,086) also discloses a capacitive level sensor for a bilge pump including a capacitive sensor plate 79 positioned in a bilge at a position selected for pump actuation. The sensor is contained within a sealed housing 32 to keep bilge water away from the sensor and other circuitry. Here again, bilge water is sensed as a dielectric, in a manner of speaking, and so the sensor is susceptible to false alarms or missed detections once the contamination accompanying bilge inflow has accumulated in the bilge and contaminated the area around the sensor, and sloshing bilge water is likely to cause the bilge control to actuate when the bilge level does not require pumping.

Santiago (U.S. Pat. No. 4,766,329) discloses a solid-state two level sensor for a bilge pump including a high water level probe and a low water level probe, both positioned in a bilge at positions selected for pump actuation. The probes are in contact with the bilge water, and so the probe sensors are susceptible to false alarms or missed detections once the contamination accompanying bilge inflow has accumulated in the bilge and contaminated the probes.

Farr (U.S. Pat. No. 5,238,369) discloses a system for liquid level control including upper and lower capacitive level sensors 10, 18 having positions selected for pump actuation. This reference is silent on the need to keep bilge water away from the sensors, but the bilge water is sensed as a dielectric, in a manner of speaking, and so the sensor is susceptible to false alarms or missed detections once the contamination accompanying bilge inflow has accumulated in the bilge and contaminated the area around the sensors.

The applicant has licensed a Field Effect sensor patent to Caldwell (U.S. Pat. No. 5,594,222) on a "touch sensor" used to detect whether a user presses a virtual button; this sensor is referred to as a "touch sensor." While the patent discloses the electromagnetic properties of Field Effect "touch" sensing, it is silent on how such technology might be employed in a sensor system for detecting a fluid/air interface or for automated bilge pump actuation.

There is a need, therefore, for a system for sensing liquid level and liquid level control that overcomes the problems with prior art sensors and systems, permitting installation of a reliable, inexpensive fluid level sensing system which is unlikely to require maintenance or cleaning in the bilge. It would be highly desirable to have a new and improved proximity detection system which is highly reliable and relatively inexpensive to manufacture. Such a proximity detection system should be highly sensitive and possess a wide range of applications.

SUMMARY OF THE INVENTION

The fluid level control and sensor system of the present invention comprises a fluid tight housing or container and a circuit board with electrodes and interconnect patterns assembled with components to create an electric field having arc shaped patterns and sense changes using the field effect principle.

The housing or container holds first and second electrode patterns in a vertical orientation and has ribs on the housing's sides to allow debris found in a bilge to slough off. By careful selection of materials, the container can resist biological attack (e.g., fungus or algae) and prevent fouling from other materials that might stick to the container otherwise. In the vertical position, gravity also helps to allow the anticipated contamination to slough off.

The field effect is described elsewhere in U.S. Pat. No. 5,594,222 and others assigned to TouchSensor, LLC, which are typically used in large appliance applications for operator input. A similar principle is adapted to detect liquids in close proximity to the sensor, even when isolated from the liquid by a physical barrier, such as a tank wall or molded container. This technique rejects common mode contamination to the sensor and, through proper tuning of the device, allows the presence or absence of a liquid to be detected. Since this is a solid state device in close proximity to the detector and it is also low impedance, it is also very tolerant of electrical noise in the marine environment.

The electrode design can have geometries ranging from parallel plates to concentric rings of various sizes and geometric shapes. The design of the electrodes is determined by the materials of construction, thickness, composition of the liquid and other considerations.

Since the fluid level control and sensor system is submerged when active and passing current, an internal current switching device (e.g. a Field Effect Transistor (FET)) adapted to pass twenty amps is easily cooled.

Electronics to support the sensor optionally include components allowing control of devices demanding twenty amps of current without the addition of a separate relay. Through current scalping and other techniques, the bilge pump control system of the present invention operates through two wires or can have a separate third wire to provide power. The fluid level control and sensor system can be implemented with or without a microprocessor.

The bilge pump assembly consists of a housing, circuit board, components and wiring harness. In operation, the bilge pump sensor is installed in-line between the pump and a power supply. The circuit draws its own power from the power mains supply without activating the pump. Without bilge liquid present near the sensor electrodes, a sensing IC is at a first state, "off." With a liquid present near the sensor electrodes, the IC changes state to "on" and the circuitry allows connection of power to the bilge pump. The pump is activated until the liquid level goes below the sensor electrodes. The sensing IC changes state to "off" and the power to the pump is interrupted, causing the pump to stop. The sequence is repeated whenever liquid comes in proximity to the sensor. An optional microprocessor allows control of on-off timing and other time management operations provide a stable pump operation without rapid changes from the "on" to the "off" state (e.g., due to an instability referred to as "sloshing"). Sloshing may vary in amplitude depending on the length of craft and bilge tank and the rocking motion of the craft.

The bilge pump controller of the present invention includes a field effect sensor comprising an active, low impedance sensor on a dielectric substrate. The sensor has a first conductive electrode pad and a second conductive electrode which substantially surrounds the first electrode in a spaced apart relationship. The first electrode pad has a closed, continuous geometric shape and both electrodes are attached to the same surface of the substrate. An active electrical component is placed in close proximity to the electrodes.

The sensor is used to replace conventional switches and is activated when bilge fluid or water contacts or comes into close proximity with the substrate. The sensor is used to turn an electric pump motor on or off. The field effect sensor design operates properly with liquids present on the substrate and in the presence of static electricity, and is well-suited for use in an environment where water, grease and other liquids are common, such as boat bilges or other sea-going applications.

Electrodes are attached to the back surface of a substrate, opposite the front or "wet" surface, thereby preventing contact between the electrodes and the controlled fluid (e.g., bilge water). Since the sensor electrodes are not located on the wet surface of the substrate, the sensor is not damaged by scratching, cleaning solvents or any other contaminants which contact the substrate.

The cost and complexity of the sensor is reduced since a relay or switch is not required.

In the preferred form, an oscillator is electrically connected to the inner and outer electrodes through gain tuning resistors and delivers a square-wave like signal having a very steep slope on the trailing edge. The oscillator signal creates an arc shaped transverse electric field between the outer electrode and the center electrode. The electric field path is arc-shaped and extends through the substrate and past the front surface, projecting transversely to the plane of the substrate. The inner and outer electrode signals are applied as common mode signals to the inputs of a differential sensing circuit and when the difference in response between the inner and outer electrodes is great enough, the sensing circuit changes state (e.g., from high to low). The sensing circuit state is altered when the substrate is touched by the controlled fluid.

In the preferred form, an active electrical component preferably configured as a surface mount application specific integrated circuit (ASIC), is located at each sensor. Preferably, the ASIC is connected to the center pad electrode and to the outer electrode of each sensor. The ASIC acts to amplify and buffer the detection signal at the sensor, thereby reducing the difference in signal level between individual sensors due to different lead lengths and lead routing paths. A plurality of sensors may be arranged on the substrate.

The above and still further features and advantages of the present invention will become apparent upon consideration of the following detailed description of a specific embodiment thereof, particularly when taken in conjunction with the accompanying drawings, wherein like reference numerals in the various figures are utilized to designate like components.

DESCRIPTION OF THE PREFERRED EMBODIMENT

Figure 1:
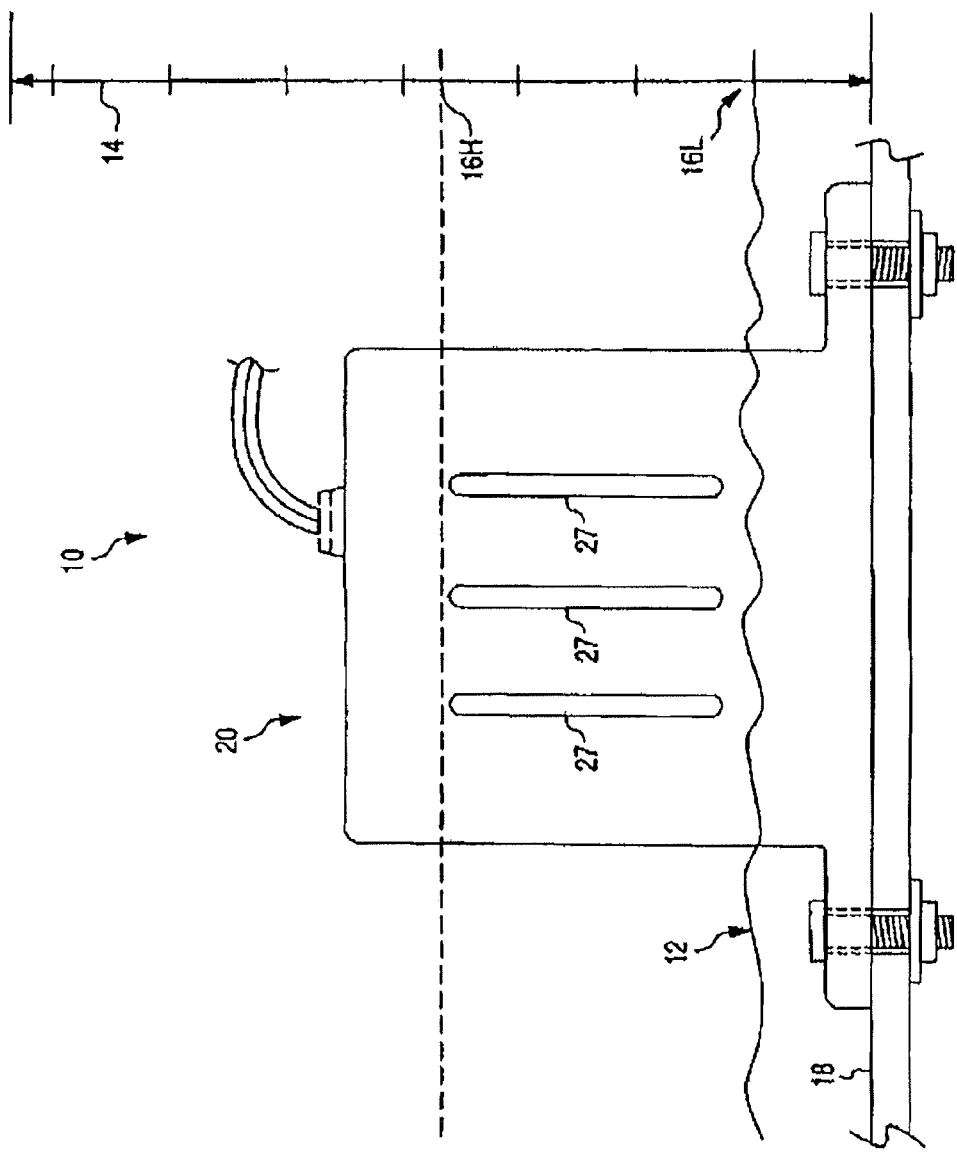
FIG. 1 is a side view, in elevation, of a bilge fluid level control and sensor system, in accordance with the present invention.

Referring to the exemplary embodiment illustrated in FIGS. 1-5, a bilge or fluid containment vessel 10 is bounded by a fluid tight wall or surface 18 and at times contains bilge water or some other fluid 12. The fluid level in the bilge rises and falls and the fluid level is measurable over a selected dimension such as that shown by the vertical scale in FIG. 1. As the fluid level rises or falls, a fluid/air interface 16 can be sighted or measured along the fluid level scale. In the typical marine application, bilge 10 contains fluid 12 such as waste water or seawater that leaks through the hull or deck, and when the bilge fluid level is excessively high (e.g., at a selected upper or trigger level 16H), fluid 12 must be pumped out, usually with an electrically powered pump (not shown) that is selectively energized when the excessively high fluid level 16H is detected. The fluid level is sensed while pumping progresses and the pump is turned off when the level of fluid 12 is low enough (e.g., at a selected lower or turn-off level 16L).

Figure 2:
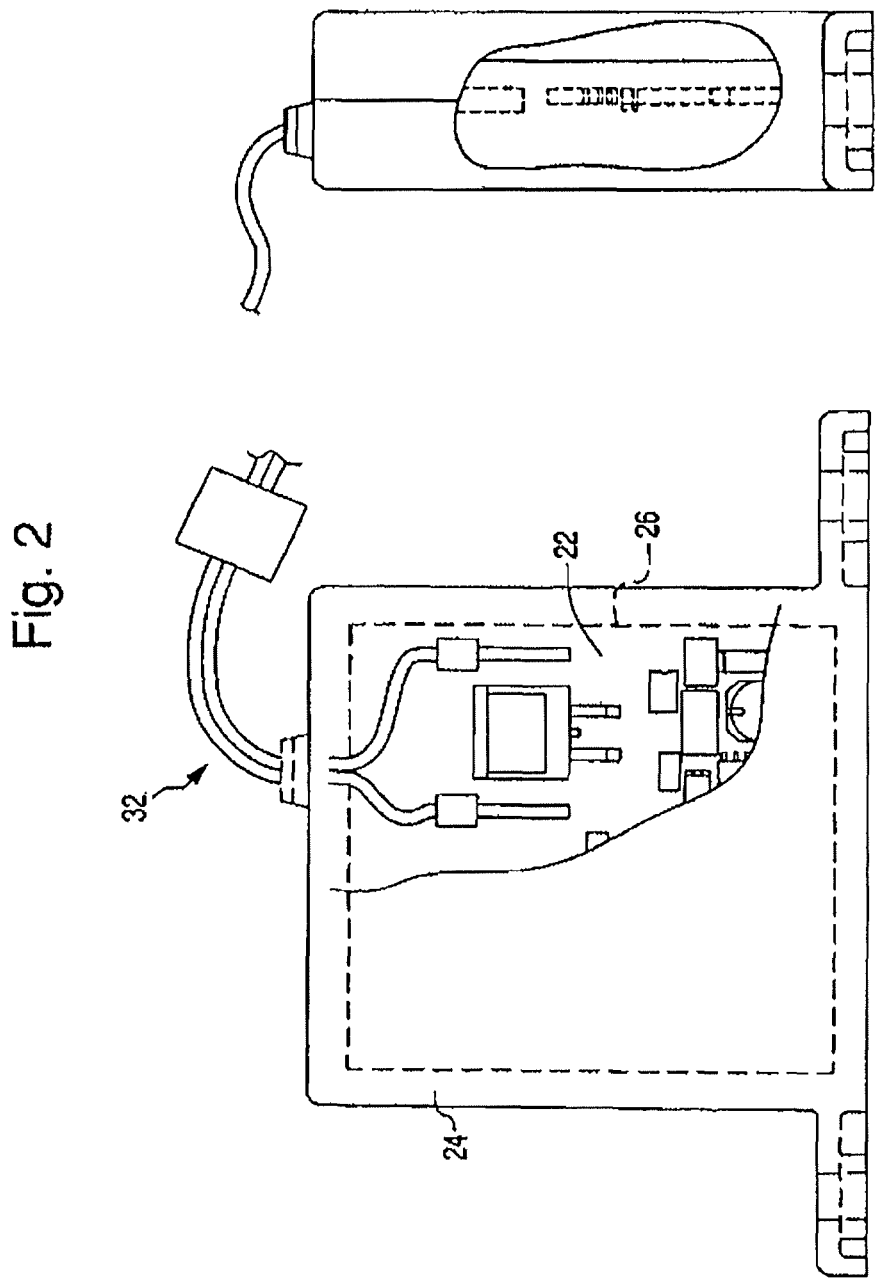
FIG. 2 is a partial cross section, in elevation, of the fluid level control and sensor system of FIG. 1, in accordance with the present invention.
Figure 3:
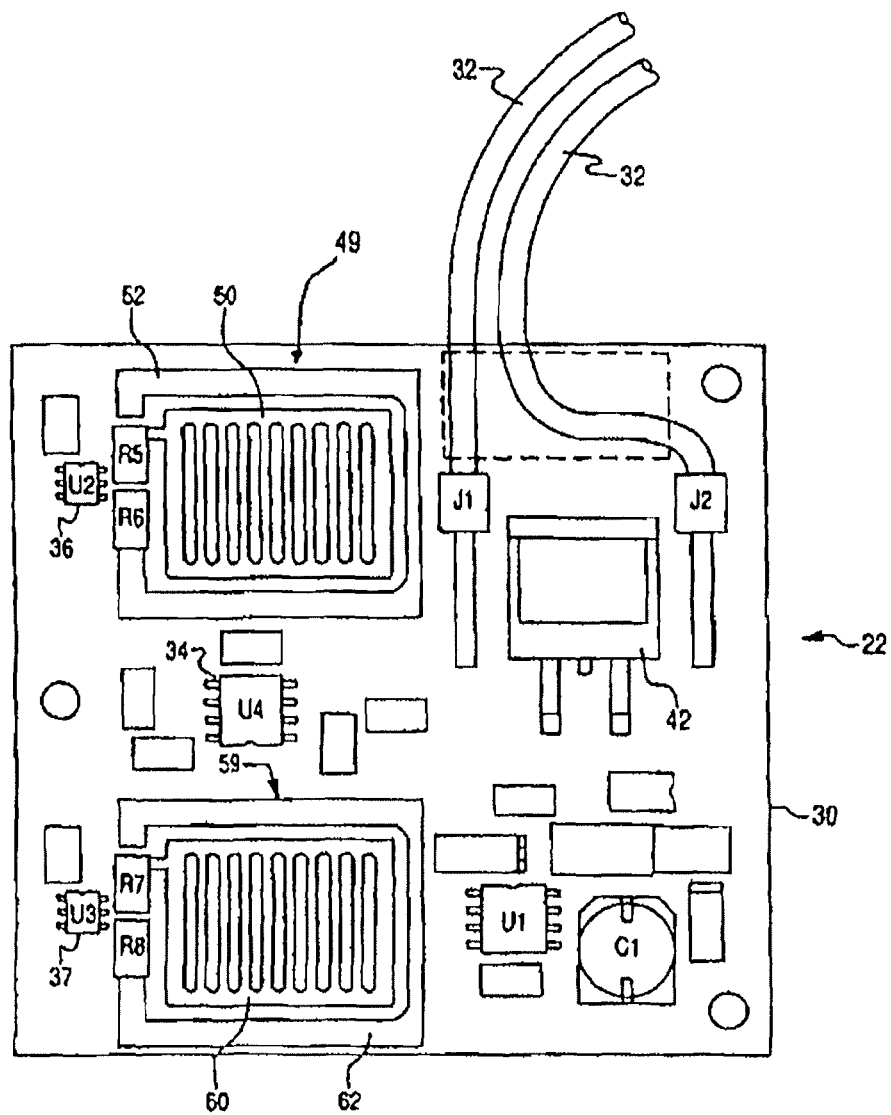
FIG. 3 is a back side view, in elevation, of the primary, back or dry surface of a printed wiring board assembly for the fluid level control and sensor system of FIGS. 1 and 2, in accordance with the present invention.

As shown in FIGS. 1, 2 and 3, fluid level control and sensor system 20 of the present invention comprises a fluid tight housing or container 24 and a printed wiring board assembly 22 with electrodes 50, 52, 60 and 62 and interconnect patterns assembled with components to create an electric field having arc shaped patterns and sense changes using the "field effect" principle.

Figure 4:
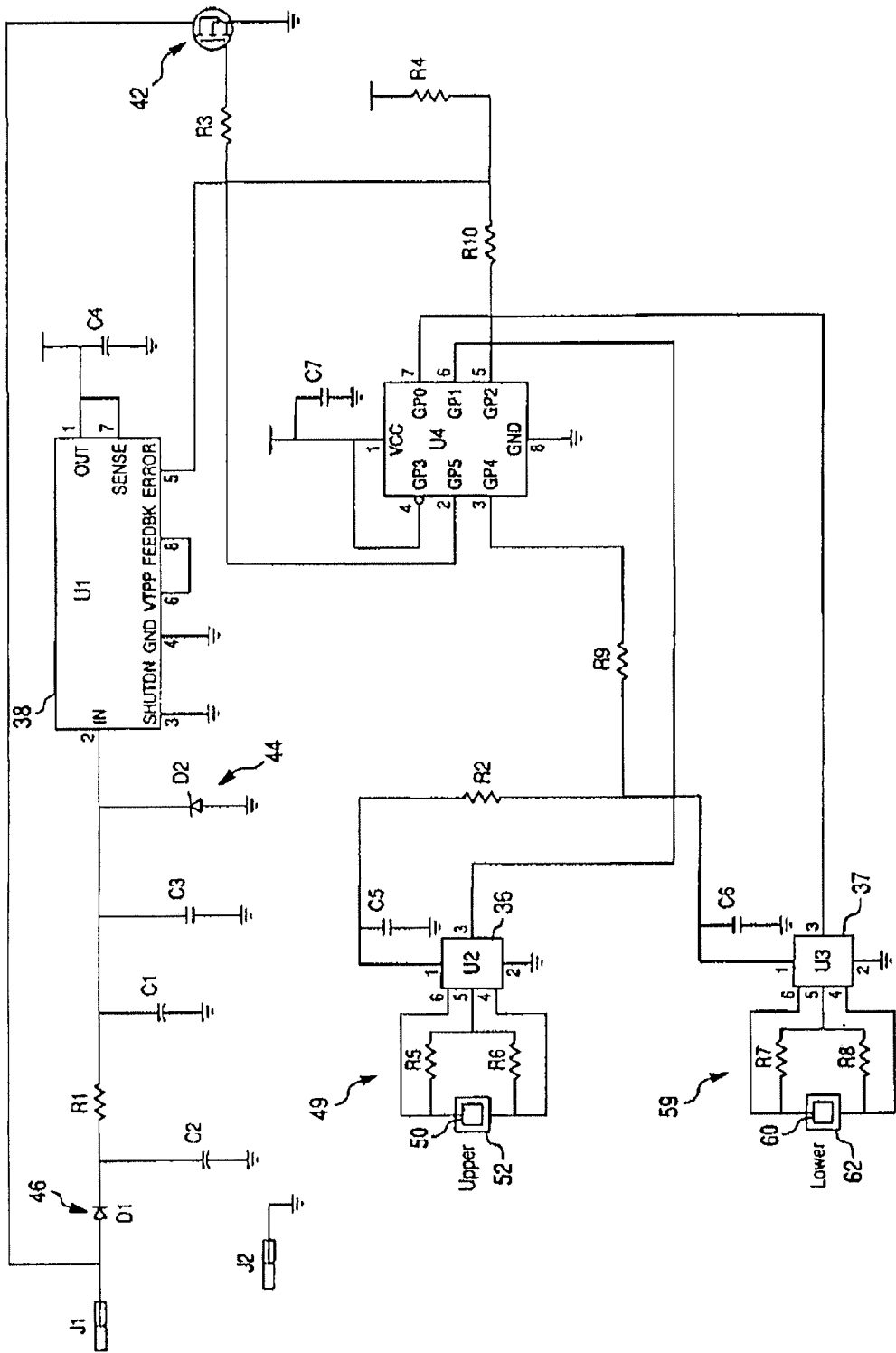
FIG. 4 is a schematic diagram of the printed wiring board assembly for the fluid level control and sensor system of FIGS. 1, 2 and 3, in accordance with the present invention.
Figure 5:
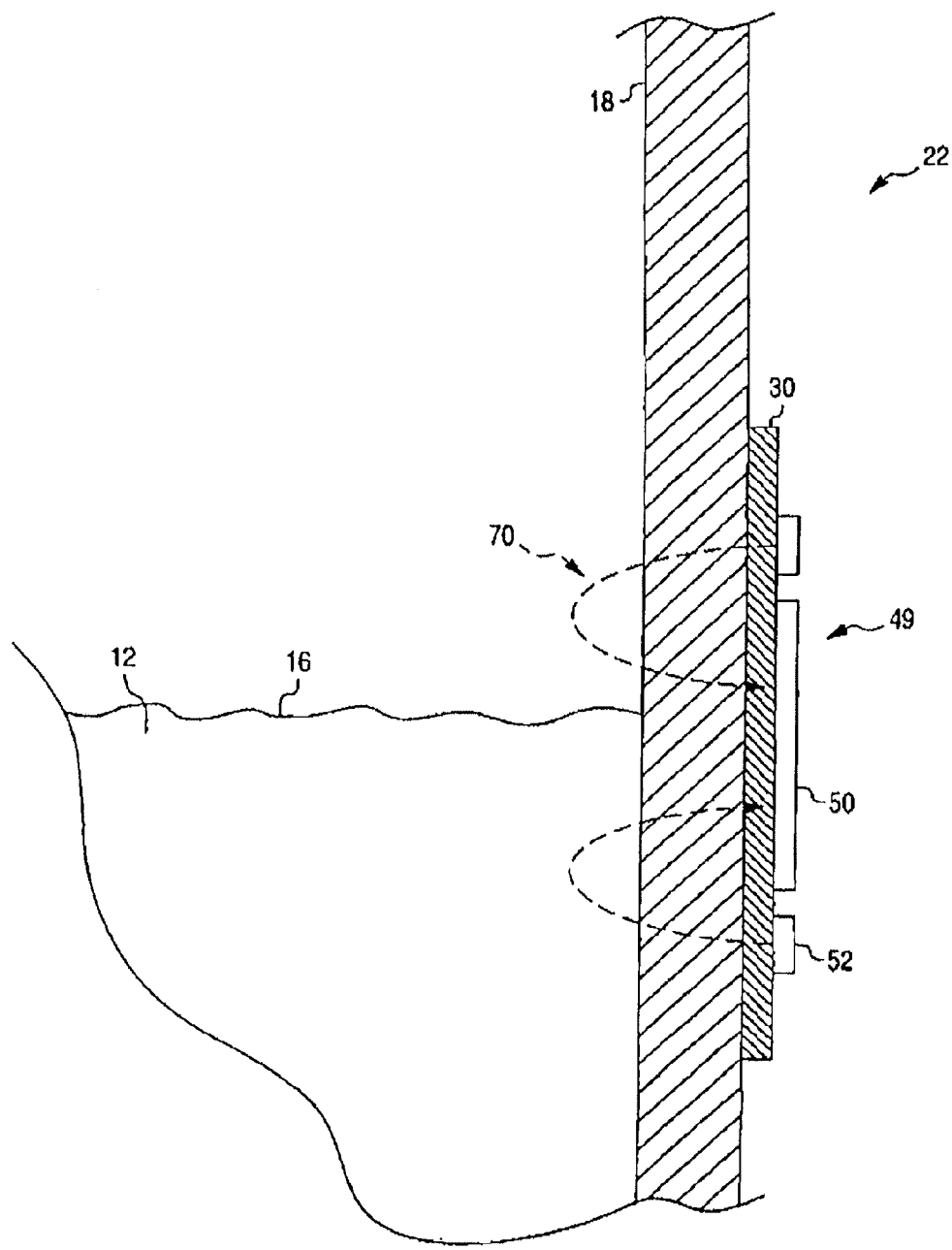
FIG. 5 is a diagram illustrating a field effect fluid level sensor system showing the arc-shaped field passing through the fluid, in accordance with the present invention.

Referring to FIGS. 4 and 5, the field effect is generated and changes in the field are sensed using patterns of conductive traces or electrodes 50, 52 which create arc shaped electric fields 70 projecting transversely and passing through substrate 30. When a rising fluid/air interface 16 is sensed, the arc shaped electric fields 70 pass through the fluid 12 rather than the air above the fluid/air interface. The operation of the sensor system 20 will be described in greater detail below.

In the embodiment of FIG. 1, printed wiring board assembly 22 is disposed within a cavity 26 of housing or container 24 and, during assembly, is sealed inside to provide a fluid proof barrier of substantially uniform thickness. Printed wiring board or circuit board 30 is a dielectric planar substrate of substantially uniform thickness having a back side (shown in FIGS. 2 and 3) carrying the components and opposite a front side. The sensor system 20 is connected to a mains supply and an electric pump (not shown) via a two cable wire assembly 32 preferably comprising at least first and second sixteen gauge (16 AWG) wire segments.

The electrical components in the sensor embodiment illustrated in FIGS. 2, 3 and 4 include a pre-programmed integrated circuit (IC) eight bit micro-controller also identified as U4, which is connected to and responsive to first and second touch switch ICs, 36, 37 also identified as U2 and U3, respectively. A sensor system power supply includes voltage regulator 38, also identified as U1, and the mains supply voltage is also controlled by a pair of diodes including series connected diode 46 and shunt connected zener diode 44 providing power to a voltage regulator 38.

In the illustrated embodiment, the bilge water pump actuation and supply comes from a large switching N channel Field Effect Transistor (NFET) 42, the mains supply voltage (e.g., 12 VDC) is connected through connector J1 to the drain and the current, when switched on to actuate the pump, passes through the source and through connector J2 to the pump.

As best seen in FIG. 3, a first sensor electrode pattern 49 includes a substantially rectangular upper center electrode pad 50 including a plurality of vertical conductive traces separated by approximately equal width sections of non-conductive PCB surface, where each conductive trace is connected at its upper and lower ends by a surrounding conductive trace, all connected to resistor R5. Upper center electrode pad 50 is not quite completely encircled by upper outer electrode 52 which is connected to upper touch sensor ASIC 36.

Both inner pad 50 and outer electrode 52 are at least partly encircled by a perimeter of solid conductive trace material to provide a ground ring (not shown). The ground ring can be configured to influence sensitivity and directionality of outer electrode 52; if the ground ring is situated too closely to outer electrode 52, however, the sensor's differential mode is lost and the sensor behaves in a single ended fashion.

A second sensor electrode pattern 59 is disposed in a vertically aligned orientation below the first sensor electrode pattern 49 and includes a substantially rectangular lower center electrode pad 60 including a plurality of vertical conductive traces separated by approximately equal width sections of non-conductive PCB surface, where each conductive trace is connected at its upper and lower ends by a surrounding conductive trace, all connected to resistor R7. Lower center electrode pad 60 is not quite completely encircled by lower outer electrode 62 which is connected to lower touch sensor ASIC 37. Both pad 60 and outer electrode 62 are also at least partially encircled by a second perimeter of solid conductive trace material to provide a second ground ring (not shown).

In accordance with the present invention, the field effect principle is adapted to detect liquid 12 when in close proximity to sensor 20, even when isolated from the liquid by a physical barrier such as a tank wall or molded container (e.g., 24). This technique rejects common mode contamination to the sensor and, through proper tuning of the device, allows the presence or absence of liquid or fluid (e.g., bilge water 12) to be detected. Since the touch sensors ASICs 36, 37 are solid state devices in close proximity to the electrode pads and also of low impedance, they are also very tolerant of electrical noise in the marine environment.

The electrode design can have geometries ranging from parallel plates to concentric rings of various sizes and geometric shapes. The design of the electrodes (e.g., 50, 52, 60 and 62) is determined by the materials of construction, thickness, composition of liquid 12 and other considerations, as will be appreciated by those with skill in the art.

In the illustrated embodiment, the electronics supporting the sensor include components allowing control of devices (e.g., a pump) demanding 20 amps of current without the addition of a separate relay. Since fluid level control and sensor system 20 is submerged when active and passing current, heat sinking to the bilge fluid 12 allows an internal current switching device (e.g. NFET 42) and a twenty amp supply circuit to be easily cooled.

Through current scalping and other techniques, the fluid level control and sensor system 20 operates through two wires or can have a separate third wire (not shown) to provide power. Current scalping or scavenging utilizes the error output of voltage regulator 38 as an input to microprocessor 34 which is programmed to turn off FET switch 42 for a short interval during which shunt storage capacitor C1 charges back to 12 volts. This current scalping method permits an "on-time" for FET switch 42 of at least 97%.

Fluid level control and sensor system 20 can be implemented with or without a microprocessor (not shown).

Housing or container 24 supports and protects first and second electrode patterns 49 and 59, in a vertical orientation and optionally has one or more external ribs transversely projecting vertically aligned elongated features 27 on the housing's sides to allow bilge debris to slough off or away from housing 24 as the fluid level falls during pumping. Housing 24 is preferably made of inert materials such as ABS, polypropylene or epoxy to resist biological attack (e.g., fungus or algae) and prevent fouling from other substances that might otherwise tend to stick to the housing or container sidewalls. In the vertical orientation or position shown in FIG. 1, gravity also helps to allow the anticipated contamination to slough off.

In operation, the bilge pump sensor 20 is installed in-line between the pump and a power mains supply using wire assembly 32. The circuit draws its own power from the power mains supply through connector J1 without activating the pump. Without bilge liquid present near the sensor electrodes, each of the sensing ICs 36, 37 is at a first state, "off." With liquid 12 present near the sensor electrodes, the sensing ICs 36, 37 change state to a second state, "on", and the circuitry connects power through FET 42 to the bilge pump. The pump remains activated until the sensed liquid level 16 goes below the sensor electrodes 49 and 59. The sensing ICs 36, 37 then change state to "off" and the power to the pump is interrupted, causing the pump to stop. This sequence is repeated whenever the fluid surface 16 comes into proximity with the sensor system 20. An optional microprocessor allows control of on-off timing and other time management operations to provide a stable pump operation without rapid changes from the "on" to the "off" state (e.g., due to an instability referred to as "sloshing"). Sloshing may vary in amplitude depending on the length of craft and bilge tank and the rocking motion of the craft.

The bilge pump controller or sensor system 20 of the present invention includes at least one field effect sensor comprising an active, low impedance sensor attached to only one side of dielectric substrate 30 and is used to replace conventional switches. The field effect sensor design operates properly with liquids present on the substrate and in the presence of static electricity, and is well-suited for use in a marine environment where water, grease and other liquids are common, such as boat bilges or other sea-going applications.

As shown in FIG. 5, the sensor's printed wiring board assembly 22 may be molded or fabricated into the bilge sidewall 18 rather than being separately encapsulated in housing 24, with the front or "wet" side of the PC board 30 facing the interior of the bilge 10.

Preferably, sensor electrode patterns 49, and 59 are attached to the back surface of PCB substrate 30. The back surface of the substrate is opposite the front or "wet" surface, thereby preventing contact of the electrodes by the controlled fluid (e.g., bilge water). Since the sensor electrodes are not located on the front surface of the substrate, the sensor is not damaged by scratching, cleaning solvents or any other contaminants which contact the front surface of the substrate. Furthermore, the cost and complexity of the sensor is reduced since a switch is not required.

Preferably, an active electrical component, such as a surface ASIC (e.g., 36) is located at each sensor and connected between the center electrode (e.g., 50) and the outer electrode (e.g., 52) of each sensor. The ASIC acts to amplify and buffer the detection signal at the sensor, thereby reducing the difference in signal level between individual sensors due to different lead lengths and lead routing paths.

The Integrated circuit connected to the field effect sensor electrodes is an active device and, in the illustrated embodiment, is preferably configured as ASIC operating in the manner described in U.S. Pat. No. 6,320,282, to Caldwell, the entire disclosure of which is incorporated herein by reference. As described above, a simple field effect cell has two electrodes (e.g., 50, 52), an ASIC (e.g., 36) and two gain tuning resistors (e.g., R5 and R6). The pin-out for the TS-100 ASIC of the invention is similar to that illustrated in FIG. 4 of the '282 patent, but the pin-outs vary slightly. The TS-100 ASIC is available from Touch Sensor, LLC. Specifically, for the TS-100 ASIC shown in this application, the input power (Vdd) connection is on pin 1, the ground connection is on Pin 2, the sensor signal output connection is on pin 3, the outer electrode resistor (e.g., R6) is connected to pin 4, the "oscillator out" connection is at pin 5 and the inner pad electrode resistor (e.g., R5) is connected to pin 6. Optionally, an ASIC can be configured to eliminate the need for gain tuning resistors R5 and R6 by making the gain tuning adjustments internal to the ASIC.

The sensitivity of the field effect sensor or cell is adjusted by adjusting the values of gain tuning resistors R5 and R6. The sensor of the present invention can be adapted for use in a variety of applications and the gain resistors R5 and R6 can be changed to cause a desired voltage response. The sensor of the present invention is like other sensors in that the sensor's response to measured stimulus must be tuned or calibrated to avoid saturation (i.e., from gain/sensitivity set too high) and to avoid missed detections (i.e., from gain/sensitivity set too low). For most applications, a gain tuning resistor value which yields a sensor response in a linear region is preferred. The tuning or calibration method typically places the sensor assembly in the intended sensing environment and the circuit test points at the inputs to the decision circuit (e.g., points 90 and 91 as seen in FIG. 4 of Caldwell's '282 patent) are monitored as a function of resistance. The resistance value of the gain tuning resistors R5 and R6 are adjusted to provide an output in the mid-range of the sensor's linear response.

While other electrode patterns are suitable for this bilge pump control application, the illustrated electrode patterns 49 and 59, as shown in 3, are each balanced. "Balanced" as used here, means that the conductive trace area of the inner electrode (e.g., center pad 50) is equal (or as equal as possible within PCB manufacturing tolerances) to the area of its corresponding outer electrode ring (e.g., outer electrode 52).

The applicants have discovered that the illustrated balanced pad electrode design provides improved noise or electromagnetic interference (EMI) immunity and works exceptionally well for sensing the presence of a fluid such as water.

The EMI immunity appears to stem from a common mode rejection of spurious noise or interference signals. This "common mode" rejection is attributable to the equal area of the center pad and the outer ring electrode, which appear to be affected by spurious noise or interference signals substantially equally, and so when one electrode's signal is subtracted from the other electrode's signal, the common noise/interference signals cancel one another.

In the embodiment illustrated in FIG. 3, each balanced center pad is substantially rectangular having a horizontal extent of approximately twelve millimeters (mm) and a vertical extent of nine mm. As can be seen from FIG. 3, each center electrode pad (e.g., 50 and 60) include a plurality of vertical conductive traces (each approx. one mm in width) separated by approximately equal width sections of non-conductive PCB surface, where each conductive trace is connected at its upper and lower ends by a surrounding conductive trace material, all connected to a resistor (e.g., R5 for upper pad 50). Each center electrode pad (e.g., 50) is not quite completely encircled by upper outer electrode 52 which is approximately 1.5 mm in width and is connected to an ASIC (e.g., 36).

Figure 6:
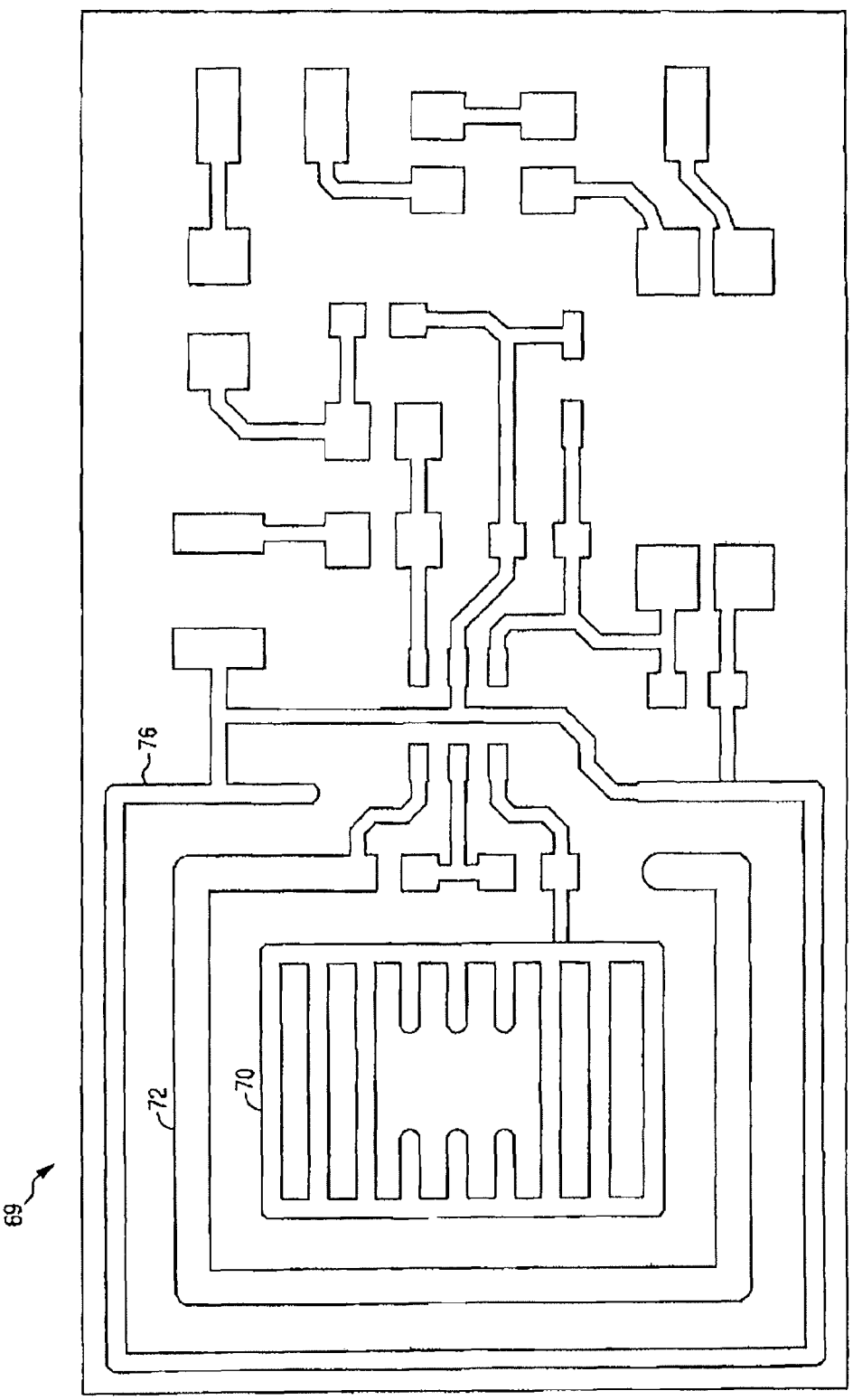
FIG. 6 is a diagram drawn to scale and illustrating the component side layout of conductive traces on a printed circuit board including a balanced pad sensor electrode pattern.
Figure 7:
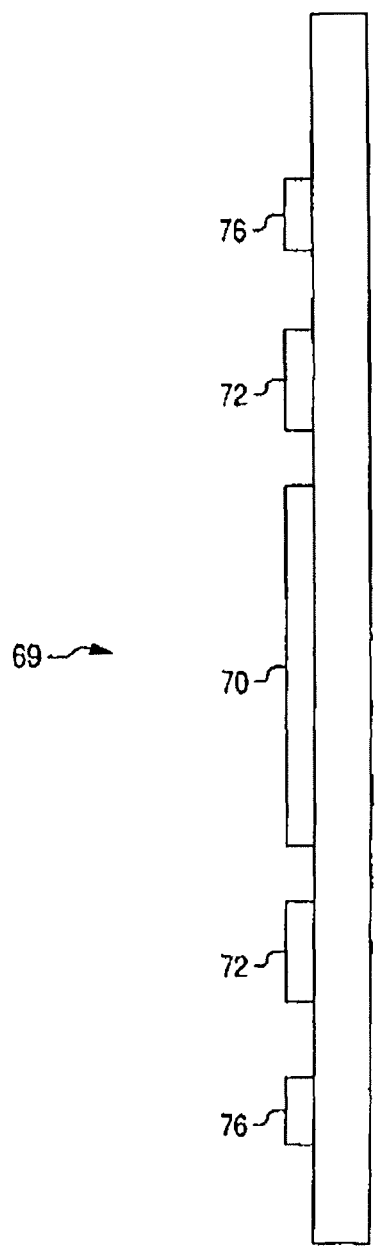
FIG. 7 is an edge view, in elevation, illustrating the conductive traces on the printed circuit board of FIG. 6 including the balanced pad sensor electrode pattern, as seen from the side.

An alternative electrode pattern embodiment is illustrated in FIGS. 6 and 7; FIG. 6 is a diagram drawn to scale and illustrating the component side layout of conductive traces on a printed circuit board including a balanced pad sensor electrode pattern 69, and FIG. 7 is an edge view, in elevation, illustrating the conductive traces of balanced pad sensor electrode pattern 69, as seen from the side of the PCB (e.g., such as PCB 30). As noted above, a balanced pad or electrode pattern has a conductive trace area for the inner electrode (e.g., center pad 70) that is equal (or as equal as possible within PCB manufacturing tolerances) to the area of its corresponding outer electrode ring (e.g., outer electrode 72). Both pad 70 and outer electrode 72 are also optionally encircled by a perimeter of solid conductive trace material to provide a ground ring 76.

The optional ground ring 76 is useful for reducing the effects of the boat or bilge material on the operation of the sensor 20. When a ground ring 76 is included, sensor 20 may be installed in either a conductive (e.g. aluminum or steel) bilge or a dielectric (e.g., fiberglass) bilge with negligible effects on sensor performance.

Figure 8:
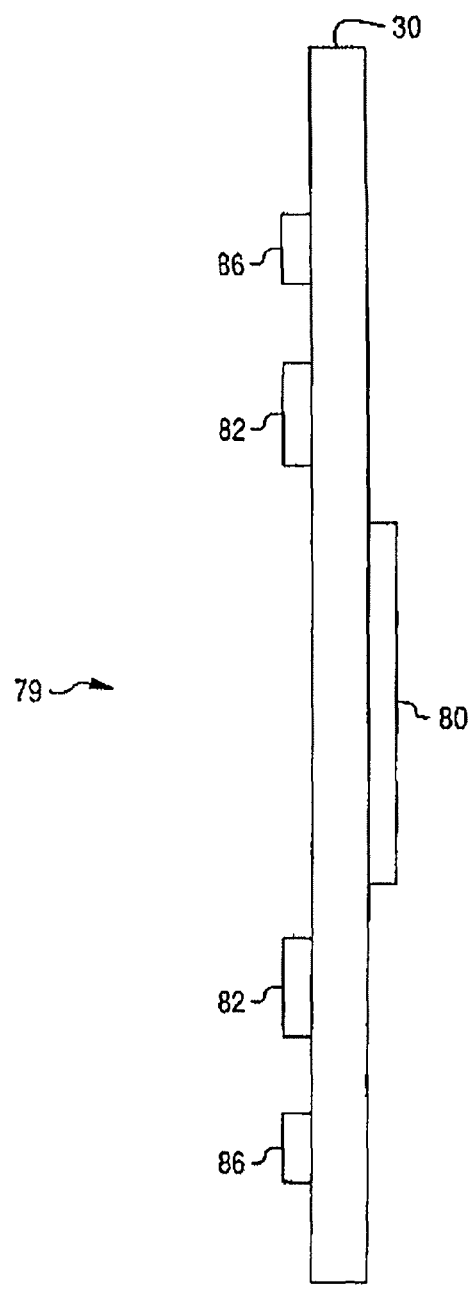
FIG. 8 is an edge view, in elevation, of an alternative two-sided embodiment illustrating the conductive traces on a printed circuit board including the balanced pad sensor electrode pattern, as seen from the side.

An alternative electrode pattern embodiment is illustrated in FIG. 8, a diagram illustrating an edge view of a two-sided layout of conductive traces on a printed circuit board including a balanced pad sensor electrode pattern 79, as seen from the side of the PCB (e.g., such as PCB 30). As above, a balanced pad or electrode pattern has a conductive trace area for the inner electrode (e.g., center pad 80) carried on one side of the PCB that is equal (or as equal as possible within PCB manufacturing tolerances) to the area of its corresponding outer electrode ring (e.g., outer electrode 82) on the opposite side of PCB 30. Both pad 80 and outer electrode 82 are at least partially encircled by a perimeter of solid conductive trace material to provide a ground ring 86 which is spaced apart from outer electrode 82.

An alternative embodiment with microprocessor control can be programmed to provide delays for pump turn-on and turn-off. The micro-controller has been programmed to read the lower level pad 60 and the upper level pad 50. Both pads must be activated for at least 256 consecutive reads before the bilge pump is turned on. The interval between reads is 0.0011 seconds, resulting in 0.286 seconds of total time of continuous reads with both pads active before turning on the pump. If at any time, either sensor is not active, the read is canceled and no pump enabling action is taken. During periods when the pump is not active, the controller puts itself to sleep for 2.5 seconds and then wakes up and reads both upper and lower pads 50, 60. Thus, the time between water level readings is about 2.78 seconds. This pre-programmed algorithm would have a high probability of not turning on the pump if the water is merely sloshing around in bilge 10, but gives fairly quick response. This pre-programmed algorithm is preferably stored in a memory and operates in a manner similar to the principals of fuzzy logic.

Other methods may be used to overcome "sloshing" Various electronic methods include using simple timing circuits like "one shots", "pulse switching and timing circuits", and "low pass filtering". None of these would be as economical as using the single chip micro-computer incorporating the entire control function in simple circuit using a micro, however.

A mechanical anti-sloshing control method includes configuring a plastic chamber or shield around the sensing area and allowing water to slowly flow in and out of the chamber and sensing area thereby preventing water level from changing very rapidly in the area of the sensor. This damped flow method would not prevent sensors from switching on/off rapidly when the water level was at the very edge of activation, where slight movements of water or electrical noise would cause sensor oscillation. The mechanical anti-slosh chamber could be coupled with a simple electronic filter circuit such as a low pass and comparator, but this would require more plastic than the illustrated design. The mechanical method of slosh proofing could also be used in conjunction with our current micro-controller design. The anti-sloshing chamber may create problems if the water entry points were to get clogged due to dirt and/or debris.

The illustrated micro controller solution results in the simplest, smallest, cheapest, lowest energy consumption result with maximum flexibility and reliability, and so is preferable to non-micro solutions or mechanical methods.

Having described preferred embodiments of a new and improved method, it is believed that other modifications, variations and changes will be suggested to those skilled in the art in view of the teachings set forth herein. It is therefore to be understood that all such variations, modifications and changes are believed to fall within the scope of the present invention as defined by the appended claims.

The invention claimed is:

1. A fluid sensing pad, comprising:
a first electrode having a first trace area;
a second electrode disposed in a spaced relationship to the first electrode and at least partially surrounding the first electrode, the second electrode having a second trace area substantially equal to the first trace area;
a first gain tuning component electrically coupled to the first electrode;
a second gain tuning component electrically coupled to the second electrode;
an active electrical component electrically coupled to both first and second electrodes; and
an interconnect pattern electrically coupling the first electrode, the second electrode, and the active electrical component.

2. A fluid sensing pad according to claim 1, further comprising a device electrically coupled to the interconnect pattern, the device being controlled when fluid is sensed by the first and second electrodes.

3. A fluid sensing pad according to claim 2, wherein the device comprises a pump.

4. A fluid sensing pad according to claim 1, further comprising a current switching device electrically coupled to the interconnect pattern.

5. A fluid sensing pad according to claim 4, wherein the current switching device comprises an N-channel field effect transistor.

6. A fluid sensing pad according to claim 1, further comprising a conductive trace at least partially encircling the second electrode.

7. A fluid sensing pad, comprising:
a first electrode;
a second electrode disposed in a spaced relationship to the first electrode and at least partially surrounding the first electrode;
a first active electrical component electrically coupled to the first and second electrodes, the first active electrical component amplifying and buffering a first signal from the first and second electrodes;
a third electrode disposed vertically with respect to the first electrode;
a fourth electrode disposed in a spaced relationship to the third electrode and at least partially surrounding the third electrode;
a second active electrical component electrically coupled to the third and fourth electrodes, the second active electrical component amplifying and buffering a second signal from the third and fourth electrodes; and
an interconnect pattern electrically coupling the first electrode, the second electrode, the first active electrical component, the third electrode, the fourth electrode, and the second active electrical component, wherein the first signal starts a device and the second signal stops the device.

8. A fluid sensing pad according to claim 7, wherein the device comprises a pump.

9. A fluid sensing pad according to claim 7, further comprising a current switching device electrically coupled to the interconnect pattern.

10. A fluid sensing pad according to claim 9, wherein the current switching device comprises an N-channel field effect transistor.

11. A fluid sensing pad according to claim 7, further comprising a conductive trace at least partially encircling the second electrode.

12. A fluid sensing pad according to claim 7, further comprising a conductive trace at least partially encircling the fourth electrode.

13. A fluid sensing pad according to claim 7, further comprising a first gain tuning component electrically coupled to the first electrode.

14. A fluid sensing pad according to claim 13, further comprising a second gain tuning component electrically coupled to the second electrode.

15. A fluid sensing pad according to claim 14, further comprising a third gain tuning component electrically coupled to the third electrode.

16. A fluid sensing pad according to claim 15, further comprising a fourth gain tuning component electrically coupled to the fourth electrode.

* * * * *